United States Patent
Kim et al.

[19]

[11] Patent Number: 5,912,488
[45] Date of Patent: Jun. 15, 1999

[54] STACKED-GATE FLASH EEPROM MEMORY DEVICES HAVING MID-CHANNEL INJECTION CHARACTERISTICS FOR HIGH SPEED PROGRAMMING

[75] Inventors: Dae Mann Kim, Kyungsangbuk-do; Myoung-kwan Cho, Kyungki-do, both of Rep. of Korea

[73] Assignees: Samsung Electronics Co., Ltd, Suwon, Rep. of Korea; Postech Foundation, Pohang, Rep. of Korea

[21] Appl. No.: 08/881,444

[22] Filed: Jun. 24, 1997

[30] Foreign Application Priority Data

Jul. 30, 1996 [KR] Rep. of Korea ................ 96-31531

[51] Int. Cl.⁶ .................................. H01L 29/788
[52] U.S. Cl. ................... 257/316; 257/404; 257/336
[58] Field of Search .................... 257/314–326, 257/404, 402, 403, 335, 336, 337

[56] References Cited

U.S. PATENT DOCUMENTS

| | | | |
|---|---|---|---|
| 4,698,787 | 10/1987 | Mukherjee et al. | 365/185 |
| 4,794,565 | 12/1988 | Wu et al. | 365/185 |
| 5,032,881 | 7/1991 | Sardo et al. | 257/316 |
| 5,041,886 | 8/1991 | Lee | 357/23.5 |
| 5,235,544 | 8/1993 | Caywood | 365/185 |
| 5,422,844 | 6/1995 | Wolstenholme et al. | 257/335 |
| 5,488,245 | 1/1996 | Shimizu et al. | 257/316 |
| 5,554,553 | 9/1996 | Harai | 257/320 |
| 5,646,430 | 7/1997 | Kaya et al. | 257/408 |
| 5,719,422 | 2/1998 | Burr et al. | 257/336 |

OTHER PUBLICATIONS

A. T. Wu et al., *A Source–Side Injection Erasable Programmable Read–Only–Memory (SI–EPROM) Device*, IEEE Electron Device Letters, vol. EDL–7, No. 9, Sep. 1986, pp. 540–542.

*Primary Examiner*—David B. Hardy
*Attorney, Agent, or Firm*—Myers Bigel Sibley & Sajovec

[57] ABSTRACT

Flash EEPROM memory devices having mid-channel injection characteristics include a substrate having source and drain regions of first conductivity type therein extending adjacent a surface thereof. A stacked-gate electrode is also provided on the surface, between the source and drain regions. To provide improved mid-channel injection characteristics during programming, a preferred semiconductor channel region is provided in the substrate at a location extending opposite the stacked-gate electrode. This channel region comprises a first "source-side" region of second conductivity type (e.g., P+) and a second "drain-side" region of predetermined conductivity type (e.g., P–, N–). The second region has a lower first conductivity type dopant concentration therein than the drain region and a lower second conductivity type dopant concentration therein than said first region, and more preferably has a lower second conductivity type dopant concentration therein than said substrate. During programming, this EEPROM unit cell provides efficient mid-channel injection at high rates and at relatively low voltage levels and avoids many of the limitations associated with conventional stacked-gate EEPROM devices which typically provide less efficient drain-side injection and require relatively high voltage levels during programming. In particular, mid-channel injection of hot electrons from the channel region to the floating gate (within the stacked-gate electrode) is promoted by tailoring the conductivity of the channel region so that pinch-off occurs at a midpoint in the channel region during programming operations.

9 Claims, 11 Drawing Sheets

STACKED-GATE FLASH EEPROM MEMORY DEVICES HAVING MID-CHANNEL INJECTION CHARACTERISTICS FOR HIGH SPEED PROGRAMMING

FIELD OF THE INVENTION

The present invention relates to semiconductor devices and fabrication methods, and more particularly to semiconductor memory devices and methods of fabricating semiconductor memory devices.

BACKGROUND OF THE INVENTION

Semiconductor memory devices for storing data can typically be categorized as either volatile memory devices or nonvolatile memory devices. Volatile memory devices lose their stored data when their power supplies are interrupted, however nonvolatile memory devices retain their stored data even when their power supplies are interrupted. Thus, nonvolatile memory devices are widely used in applications where the possibility of power supply interruption is present.

Conventional nonvolatile memory devices include a type of electrically erasable programmable read only memory (EEPROM) device typically referred to as a flash EEPROM device. Flash EEPROM devices typically include a semiconductor substrate of first conductivity type (e.g., P-type), spaced source and drain regions of second conductivity type (e.g., N-type) in the substrate, a channel region at a face of the substrate, between the spaced source and drain regions, a floating gate for storing charge carriers when the device is programmed and a control gate which overlies the floating gate, opposite the channel region. Operation of a flash EEPROM device is typically divided into three modes including programming, erasing and reading.

A flash EEPROM device is typically programmed by biasing the drain region to a first positive bias, relative to the source region, and biasing the control gate to a second positive bias which is greater than the first positive bias. In the absence of any stored charge on the floating gate, these biases cause the formation of an inversion-layer channel of electrons at the face of the substrate, between the source and drain regions. As will be understood by those skilled in the art, the drain-to-source voltage establishes a lateral electric field in the substrate and accelerates the electrons across the channel to the drain region where they acquire sufficiently large kinetic energy and are typically referred to as "hot" electrons. The larger positive bias on the control gate also establishes a vertical electrical field across a tunneling oxide layer which separates the floating gate from the channel region. This vertical electric field attracts the hot electrons and accelerates them toward the floating gate, which is disposed between the control gate and the channel region, by a process known as drain-side tunneling. The floating gate then accumulates and traps the accumulated charge. Fortunately, the process of charging the floating gate is self-limiting. The negative charge that accumulates on the floating gate reduces the strength of the electric field in the tunneling oxide layer to the point where it is no longer capable of accelerating "hot" electrons from the drain side of the channel region.

As will be understood by those skilled in the art, the accumulation of a large quantity of trapped charge (electrons) on the floating gate will cause the effective threshold voltage ($V_{th}$) of the field effect transistor comprising the source region, drain region, channel region and control gate to increase. If this increase is sufficiently large, the field effect transistor will remain in a nonconductive "off" state when a predetermined "read" voltage is applied to the control gate during a read operation (i.e., $V_{th} > V_{read}$). In this state, known as the programmed state, the EEPROM device may be said to be storing a logic 0. Once programmed, the EEPROM device retains its higher threshold voltage even when its power supply is interrupted or turned off for long periods of time.

Reading of the EEPROM device is achieved by applying a predetermined read voltage ($V_{read}$) to the control gate, typically via a word line connecting a row of identical EEPROM devices or "cells", and applying a positive bias to the drain region, typically via a bit line connecting a column of identical EEPROM cells. If the EEPROM device is programmed, it will not conduct drain current ($I_{ds}$). However, if the EEPROM device has not been programmed (or has been erased), it will heavily conduct. In this state, the EEPROM device may be said to be storing a logic 1. Thus, by monitoring the bit line current, the programmed state (i.e., 1 or 0) of the EEPROM device can be determined.

The EEPROM device may be erased by removing the stored charge from the floating gate. The erasure process can be achieved, for example, by grounding the control gate and applying a positive bias to the substrate (e.g., 10–20 Volts). Accordingly, flash EEPROM devices typically require bulk erasure of large portions of an array of cells since the effects of applying a large substrate bias typically cannot be confined to a single EEPROM cell. Unfortunately, during the erasure process, an "over-erase" condition may occur and render the threshold voltage sufficiently negative that the EEPROM cell is turned-on even without the application of a control gate bias. When this occurs, the EEPROM device will conduct whenever its respective bit line is positively biased; therefore, the reading step may result in a logic error caused by the EEPROM device having a threshold voltage which is too low even after the device has been programmed.

As will be understood by those skilled in the art, the rate of drain-side tunneling during programming operations can be increased by increasing the lateral electric field in the channel and/or the vertical electric field in the tunneling oxide layer. However, low control gate voltages and high drain voltages are typically required to generate high lateral electric fields in the channel region, while exactly the opposite biasing condition—low drain voltage and high control gate voltage—is needed to create large vertical electric fields across the tunneling oxide layer. This conflict makes optimization of a flash EEPROM's programming characteristics difficult. In practice, high drain voltages and high gate voltages are used as a compromise, yet this typically means that an EEPROM device may be operating close to breakdown when programming operations are being performed. A further disadvantage inherent in drain-side channel hot-electron injection devices is the relatively low (e.g., $<10^{-7}$) hot-electron injection efficiency (defined as the number of electrons injected into the floating gate relative to the number of electron-hole pairs generated in the device channel), which is present during programming because low injection efficiency typically limits the maximum programming speed. Conventional attempts to increase the programming speed typically involve scaling down the physical dimensions of the devices, however, a reduction in physical dimensions is usually accompanied by a decrease in device yield during processing and a deterioration in the ability of the devices to maintain their programmed or erased state over time.

Referring now to FIG. 1, a stacked-gate flash EEPROM (SG-EEPROM) device according to the prior art will be described. The construction and operation of this EEPROM device is also more fully described in U.S. Pat. No. 4,698,787 to Mukherjee et al. As illustrated by FIG. 1, a stacked-gate EEPROM device may comprise a P-type substrate 1, N-type source and drain regions 3 and 5, respectively, a floating gate electrode 7 and a control gate electrode 9. To perform a programming operation, 0 Volts may be applied to the source region 3, 6 Volts may be applied to the drain region 5 and 12 Volts may be applied to the control gate electrode 9. As described above, these biases typically cause drain-side injection of hot electrons into the floating gate electrode 7. To perform an erase operation, the drain region 5 may be allowed to float electrically, 12 Volts may be applied to the source region 3 and 0 Volts may be applied to the control gate electrode 9. These biases typically cause Fowler Nordheim tunneling of electrons from the floating gate electrode 7 to the source region 3. Unfortunately, high voltages are typically required to program the SG-EEPROM device. The programming speed may also be slow because the rate of hot electron transfer from the drain side of the channel region into the floating gate may be low. The requirement that high voltages be generated typically also means that voltage boosting circuits (e.g., charge pumps) be included to provide the high voltage programming signals, however, such circuits can be relatively large and reduce the available area for memory devices.

To address these limitations associated with stacked-gate EEPROM devices, source-side injection EEPROM (SI-EEPROM) devices have been developed. In particular, an SI-EEPROM device having a select gate is disclosed in an article by A. T. Wu et al. entitled *A Source-Side Injection Erasable Programmable Read-Only-Memory (SI-EEPROM) Device,* IEEE Electron Device Letters, Vol. EDL-7, No. 9, pp. 540–542, September (1986). FIG. 2 herein is a reproduction of FIG. 2 from the Wu et al. article. In this device, a sidewall select gate electrode 19 is provided adjacent a stacked-gate structure comprising a control gate electrode 17 and a floating gate electrode 15. Opposite the gate electrodes 15–19, a semiconductor substrate 10 (e.g., P-type) is provided so that an inversion-layer channel of charge carriers (e.g, electrons) can be established therein when the device is being programmed. Source and drain regions 13 (e.g., N-type) are also provided. As will be understood by those skilled in the art, the select gate 19 acts as the gate of a select transistor, and the control gate 17 acts as the gate of a sense transistor so that the select transistor is electrically connected in series with the sense transistor. These and other aspects of the SI-EEPROM device are more fully described in U.S. Pat. No. 4,794,565 to Wu et al.

As described in the Wu et al. article, programming operations can be performed by biasing the drain region 13 at $V_{ds}$=5 Volts, the select gate 19 at $V_{sg}$=2 Volts and the control gate 17 at $V_{cg}$=15 Volts. Under these biases, the sense transistor can be expected to operate in its linear region of operation and the select transistor can be expected to operate in its saturation region of operation with pinch-off occurring at an intermediate point in the channel region. Thus, a strong lateral electric field ($E_y$) can be formed in the channel pinch-off region of the select transistor (i.e. near the source side of the sense transistor) to thereby generate hot electrons at the intermediate point. This is because most of the drain-to-source bias appears across the channel of the select transistor with relatively little voltage drop occurring across the channel of the sense transistor. A strong vertical electric field is also induced at the middle of the channel by the control gate voltage and this increases the programming rate by increasing the probability that hot electrons in the channel will be injected into the floating gate.

Notwithstanding these benefits associated with the SI-EEPROM device of FIG. 2, the fact that the channel length of the split-gate device is the combined length of both the sense transistor and the select transistor means that the unit cell area of the split-gate cell is typically larger than the unit cell area of an otherwise equivalent stacked-gate device. In addition, during the method of forming the split gate cell, the step of etching the gate insulating layer of the select transistor may damage the gate insulating film of the sense transistor. Finally, because it necessary to precisely control the length of the select gate electrode, mask misalignment errors may reduce device yield.

Accordingly, notwithstanding the above described prior art flash EEPROM devices, there still exists a need for EEPROM devices which can be efficiently programmed, have low supply voltage and power consumption requires and have small unit cell size.

SUMMARY OF THE INVENTION

It is therefore an object of the present invention to provide semiconductor memory devices having small unit cell size and methods of forming same.

It is another object of the present invention to provide integrated circuit memory devices which can be programmed efficiently and methods of forming same.

It is a further object of the present invention to provide integrated circuit memory devices having low power consumption requirements and methods of forming same.

These and other objects, features and advantages of the present invention are provided by integrated circuit memory devices which comprise an array of flash EEPROM unit cells. These unit cells contain stacked-gate electrodes and have improved mid-channel injection characteristics during programming. According to one embodiment of the present invention, a flash EEPROM unit cell comprises a substrate (e.g., P-type) having source and drain regions of first conductivity type (e.g., N+) therein extending adjacent a surface thereof. A stacked-gate electrode is also provided on the surface, between the source and drain regions. To provide improved mid-channel injection characteristics during programming, a preferred semiconductor channel region is provided in the substrate at a location extending opposite the stacked-gate electrode. This channel region comprises a first "source-side" region of second conductivity type (e.g., P+) and a second "drain-side" region of predetermined conductivity type (e.g., P−, N−). The second region has a lower first conductivity type dopant concentration therein than the drain region and a lower second conductivity type dopant concentration therein than said first region, and more preferably has a lower second conductivity type dopant concentration therein than said substrate.

During programming, this EEPROM unit cell provides efficient mid-channel injection at high rates and at relatively low voltage levels and avoids many of the limitations associated with conventional stacked-gate EEPROM devices which typically provide less efficient drain-side injection and require relatively high voltage levels during programming. In particular, mid-channel injection of hot electrons from the channel region to the floating gate (within the stacked-gate electrode) is promoted by tailoring the conductivity of the channel region so that pinch-off occurs at a midpoint in the channel region during programming operations. Here, the first source-side region ("enhancement region") in the channel region is doped with an impurity of the same conductivity type as the substrate (e.g., P-type), but at a higher level (e.g., P+) and the second drain-side region ("depletion region") is either doped with an impurity of the same conductivity type as the substrate but at a lower level (e.g, P−) or is doped with an impurity of the same conductivity type as the drain region (e.g., N-type) but at a lower level (e.g., N−).

By tailoring the doping profiles in the channel region in this manner, the preferred device acquires injection performance characteristics similar to an SI-EEPROM device having a split-gate electrode. In particular, the stacked-gate electrode and the first region act as a "select" transistor and the stacked-gate electrode and the second region act as a "sense" transistor. Thus, applications of a relatively low drain voltage ($V_{ds}$) and a relatively low control gate voltage ($V_{cg}$) are still capable of causing the "select" transistor to enter a saturated mode of operation region and the "sense" transistor to be maintained in a linear mode of operation. Thus, most of the drain voltage appears across the first source-side region (enhancement region), because of the relatively low resistivity of the second drain-side region (depletion region), and thereby induces pinch-off at a midpoint in the channel region. The establishment of almost the entire drain voltage across the first "enhancement" region causes the generation of a high lateral electric field and promotes mid-channel injection under the influence of the relatively strong vertical electric field established by the control gate voltage. Accordingly, electrons which are accelerated into the mid-channel region (i.e., drain-side of the first "enhancement region") are readily redirected vertically into the floating gate electrode before traveling to the drain-side of the second "depletion" region.

DESCRIPTION OF PREFERRED EMBODIMENTS

Figure 1:
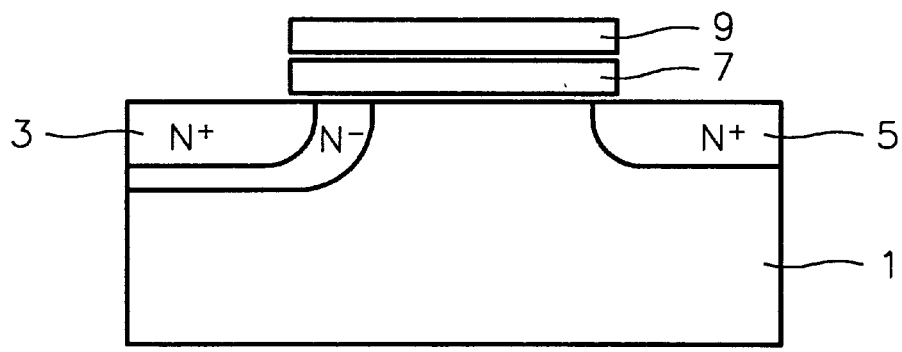
FIG. 1 is a cross-sectional view of a stacked-gate flash EEPROM device according to the prior art.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. Moreover, the terms "first conductivity type" and "second conductivity type" refer to opposite conductivity type semiconductor regions such as N or P-type and each embodiment described herein includes its complementary embodiment as well.

Figure 3:
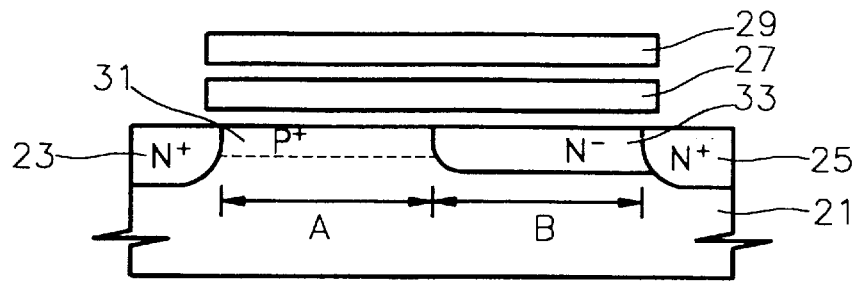
FIG. 3 is a cross-sectional view of an EEPROM device according to a first embodiment of the present invention.
Figure 4:
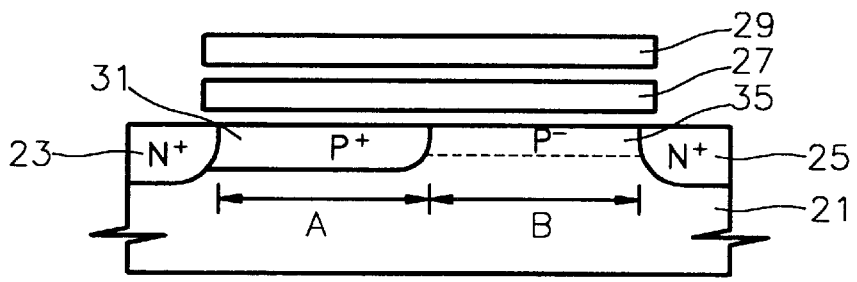
FIG. 4 is a cross-sectional view of an EEPROM device according to a second embodiment of the present invention.

Referring now to FIGS. 3–4, preferred first and second embodiments of flash EEPROM unit cells having stacked-gate electrodes and improved mid-channel hot electron injection characteristics during programming, will be described. On particular, according to preferred embodiments of the present invention, a flash EEPROM unit cell comprises a substrate 21 (e.g., P-type) having source and drain regions 23, 25 of first conductivity type (e.g., N+) therein extending adjacent a surface thereof. A stacked-gate electrode is also provided on the surface of the substrate 21, between the source and drain regions 23 and 25. This stacked-gate electrode comprises a control gate electrode 29 and a floating gate electrode 27 disposed between the control gate electrode 29 and the surface of the substrate 21.

To provide improved mid-channel injection characteristics during programming, a preferred semiconductor channel region is provided in the substrate at a location extending opposite the stacked-gate electrode. This channel region comprises a first "source-side" region 31 of second conductivity type (e.g., P+) and a second "drain-side" region 33, 35 of predetermined conductivity type (e.g., P–, N–) which has a lower first conductivity type dopant concentration therein than the drain region 23 (e.g., N+), and a lower second conductivity type dopant concentration therein than said first region 31 (e.g., P+) and more preferably less than said substrate. Accordingly, the preferred unit cell of FIG. 3 essentially comprises a channel region which has been tailor doped to provide: (i) an enhancement-type FET in region "A" with the second region 33 acting as a virtual drain region, and (ii) a depletion-type FET in region "B" with the first region 31 acting as a virtual source region. Here, the threshold voltage $V_{th}$ of the enhancement-type FET in region "A" is increased relative to an FET having a channel region comprising the substrate 21 and the threshold voltage $V_{th}$ of the depletion-type FET in region "B" is decreased ($V_{th}$ of the depletion-type FET in region "B" of FIG. 3 is actually negative) relative to an FET having a channel region comprising the substrate 21. As will be understood by those skilled in the art, for a given control gate bias $V_{cg}$, the enhancement-type FET will reach a "pinch-off" condition and saturate before the depletion-type FET.

During programming, these EEPROM unit cells of FIGS. 3–4 provide efficient mid-channel injection at high rates and at relatively low voltage levels. Thus, many of the limitations associated with conventional stacked-gate EEPROM devices, which typically provide less efficient drain-side injection and require relatively high voltage levels during programming, are eliminated. In particular, mid-channel injection of hot electrons from the channel region to the floating gate 27 (within the stacked-gate electrode) is promoted by tailoring the conductivity of the channel region so that pinch-off occurs at a midpoint in the channel region during programming operations. Here, the first source-side region 31 ("enhancement region") in the channel region is doped with an impurity of the same conductivity type as the substrate 21 (e.g, P-type), but at a higher level (e.g., P+) and the second drain-side region 33, 35 ("depletion region") is either doped with an impurity of the same conductivity type as the substrate 21 but at a lower level (e.g, P–) or is doped with an impurity of the same conductivity type as the drain region 25 (e.g., N-type) but at a lower level (e.g., N–). By tailoring the doping profiles in the channel region in this manner, the preferred EEPROM devices acquire injection performance characteristics similar to those of an SI-EEPROM device having a split-gate electrode. By analogy, the stacked-gate electrode and the first region 31 act as a "select" transistor in region "A" and the stacked-gate electrode and the second region 33, 35 act as a "sense" transistor in region "B".

Thus, as will be understood by those skilled in the art, applications of a relatively low drain voltage ($V_{ds}$) (5 Volts or less) and a relatively low control gate voltage ($V_{cg}$) (10 Volts or less) are still capable of causing the "select" transistor to enter a saturated mode of operation region and the "sense" transistor to be held in a linear mode of operation. Thus, most of the drain voltage appears across the first source-side region 31 (enhancement region), because of the relatively low resistivity of the second drain-side region 33, 35 (depletion region), and thereby induces pinch-off at a midpoint in the channel region. The establishment of almost the entire drain voltage across the first "enhancement" region 31 causes the generation of a high lateral electric field and promotes mid-channel injection under the influence of the relatively strong vertical electric field established by the control gate voltage ($V_{cg}$). Accordingly, electrons which are accelerated into the mid-channel region (i.e., drain-side of the first "enhancement region") are readily redirected vertically into the floating gate electrode 27 before traveling to the drain-side of the second "depletion" region 33, 35.

Referring now to FIGS. 14–18, methods of forming flash EEPROM devices according to a third embodiment of the present invention will be described. As illustrated best by FIG. 14, an impurity region 45 is formed in a semiconductor substrate 41 of first conductivity type (e.g., P-type). This impurity region 45 may be formed as a relatively highly doped P-type region (e.g., P+) by implanting $BF_2$ ions at an energy of about 50 KeV and a dose level of about $5\times10^{13}$ cm$^{-2}$ into a face of the substrate 41. Preferably, a sacrificial insulating film (not shown) is provided on the face of the substrate 41 to protect a portion of the substrate extending adjacent the face. After the impurity region 45 has been formed, the sacrificial insulating film is removed and then a first insulating film 43 (e.g., $SiO_2$) is formed on the face of the substrate 41. As described more fully hereinbelow, this first insulating film 43 is subsequently patterned as a tunneling oxide layer of an EEPROM memory device.

Figure 15:
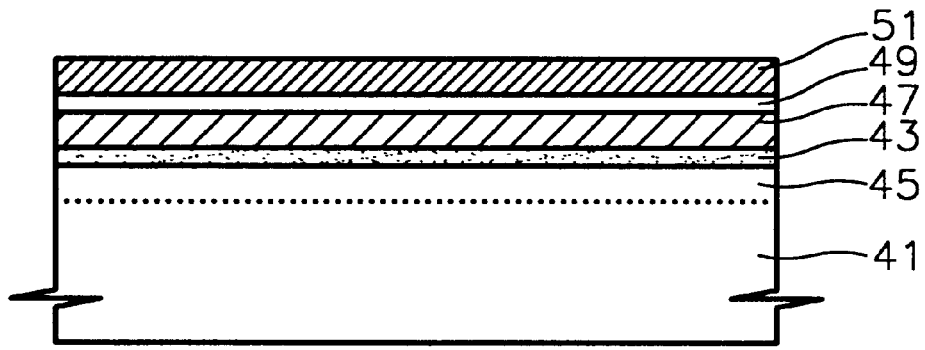
Figure 16:
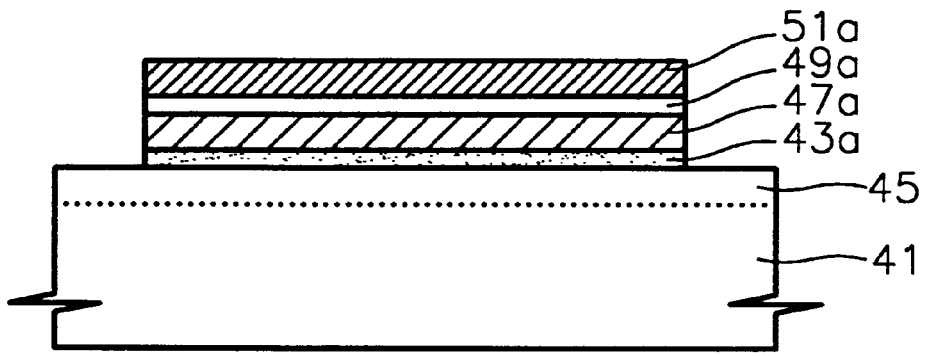

Referring now to FIG. 15, a first polysilicon film 47, a second insulating film 49 and a second polysilicon film 51 are then formed in sequence on the first insulating film 43, using conventional techniques. The second insulating film 49 may comprises a composite insulating film comprising a first layer of silicon dioxide, a second layer of silicon nitride and a third layer of silicon dioxide. As best illustrated by FIG. 16, the second polysilicon film 51, second insulating film 49, first polysilicon film 47 and first insulating film 43 are then patterned to define a stacked-gate electrode containing a control gate 51a, a dielectric interlayer 49a, a floating gate 47a and tunneling oxide layer 43a.

Figure 17:
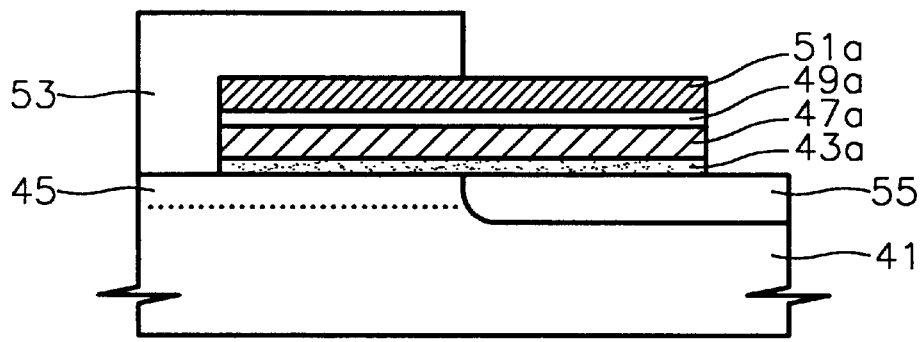
Figure 18:
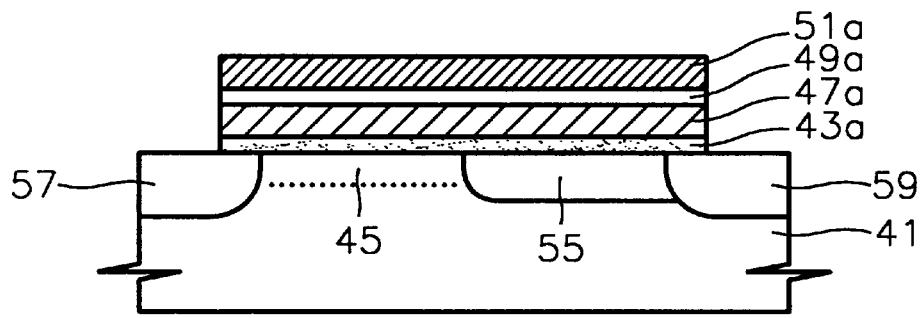

Referring now to FIG. 17, an N– impurity region 55 may be formed in the P+ impurity region 45 by patterning a layer of photoresist 53 to expose a first portion of the stacked-gate electrode and then implanting phosphorus (P) ions into the stacked-gate electrode at an energy of about 80 KeV and a dose level of about $5\times10^{14}$ cm$^{-2}$, using the patterned layer of photoresist 53 as an implant mask. The photoresist layer 53 is then removed. A thermal treatment step is then performed at a temperature of about 950° C. to diffuse the implanted phosphorus ions and more fully define the N– impurity region 55 at a position opposite the floating gate electrode 47a. Referring now to FIG. 18, source and drain regions 57 and 59 are then formed by implanting arsenic (As) ions at an energy of about 70 KeV and a dose level of about $5\times10^{15}$ cm$^{-2}$, using the stacked-gate electrode as an implant mask. An insulating layer (not shown) is then formed on the structure of FIG. 18. Contact holes are then formed in the insulating layer and then metallization is patterned in the holes to complete the flash EEPROM device by providing electrical contacts thereto.

Figure 14:
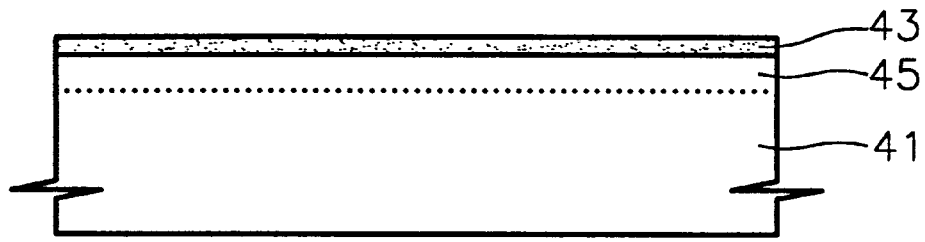
FIGS. 14–18 are cross-sectional views of intermediate structures illustrating a method of forming a flash EEPROM device, according to a third embodiment of the present invention.
Figure 19:
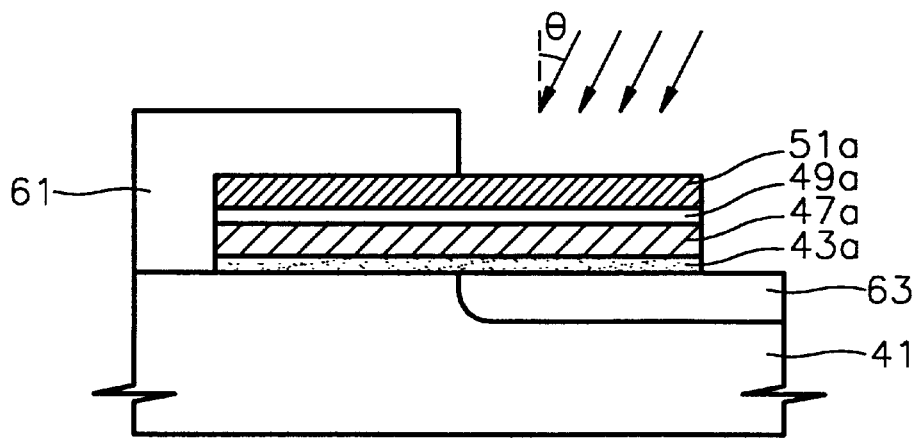
FIGS. 19–20 are cross-sectional views of intermediate structures illustrating a method of forming a flash EEPROM device, according to a fourth embodiment of the present invention.
Figure 20:
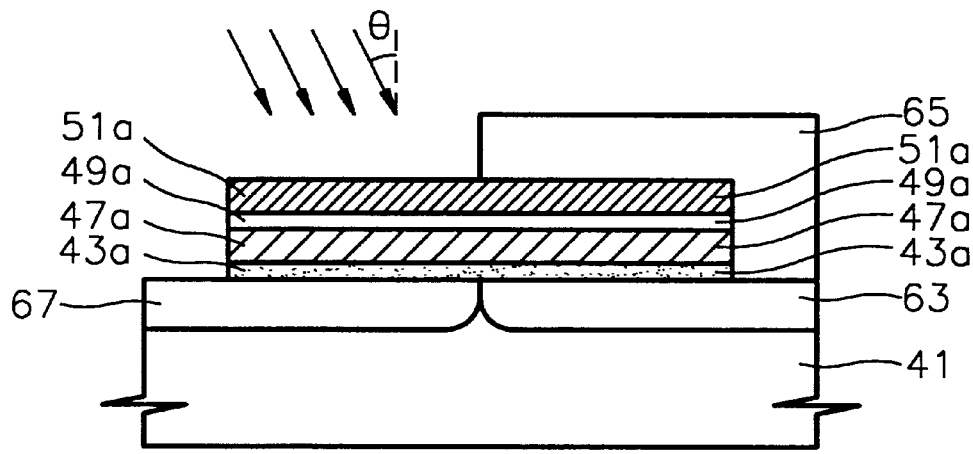

Referring now to FIGS. 19–20, methods of forming flash EEPROM devices according to a fourth embodiment of the present invention will be described. According to this fourth embodiment, the steps illustrated by FIGS. 14–16 are generally repeated, however, the step of forming the blanket impurity region 45 (illustrated in FIG. 14) is omitted. Referring now to FIG. 19, an N– impurity region 63 may be formed in the substrate 41 by patterning a layer of photoresist 61 to expose a first portion of the stacked-gate electrode and then implanting phosphorus (P) ions at a predetermined angle (φ) into the stacked-gate electrode at an energy of about 80 KeV and a dose level of about $5\times10^{14}$ cm$^{-2}$, using the patterned layer of photoresist 61 as an implant mask. The photoresist layer 61 is then removed. A thermal treatment step is then performed at a temperature of about 950° C. to diffuse the implanted phosphorus ions and more fully define the N− impurity region 63 at a position opposite the floating gate electrode 47a.

Referring now to FIG. 20, a P+ impurity region 67 may be formed in the substrate 41 by patterning a layer of photoresist 65 to expose a second portion of the stacked-gate electrode and then implanting boron (B) ions at a predetermined angle (φ) into the stacked-gate electrode at an energy of about 60 KeV and a dose level of about $5 \times 10^{13}$ cm$^{-2}$, using the patterned layer of photoresist 65 as an implant mask. Here, the predetermined angle (φ) can control the lateral position of the P+ impurity region 67 underneath the floating gate electrode 47a. The photoresist layer 65 is then removed. A thermal treatment step is then performed at a temperature of about 950° C. to diffuse the implanted boron ions and more fully define the P+ impurity region 67 at a position opposite the floating gate electrode 47a. Next, the steps described with respect to FIG. 18 are then performed to complete an EEPROM device. As will be understood by those skilled in the art, the sequence of steps illustrated by FIGS. 19 and 20 can be reversed so that the P+ impurity region 67 is formed before the N− impurity region 63.

Figure 21:
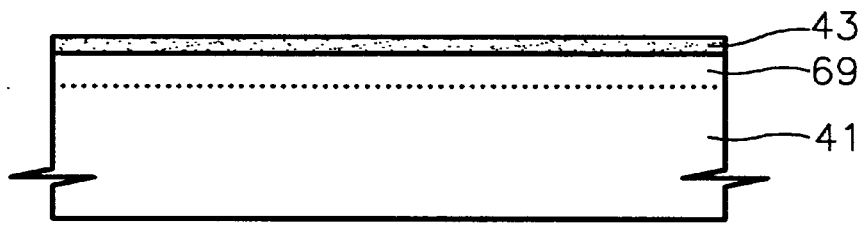
FIGS. 21–22 are cross-sectional views of intermediate structures illustrating a method of forming a flash EEPROM device, according to a fifth embodiment of the present invention.
Figure 22:
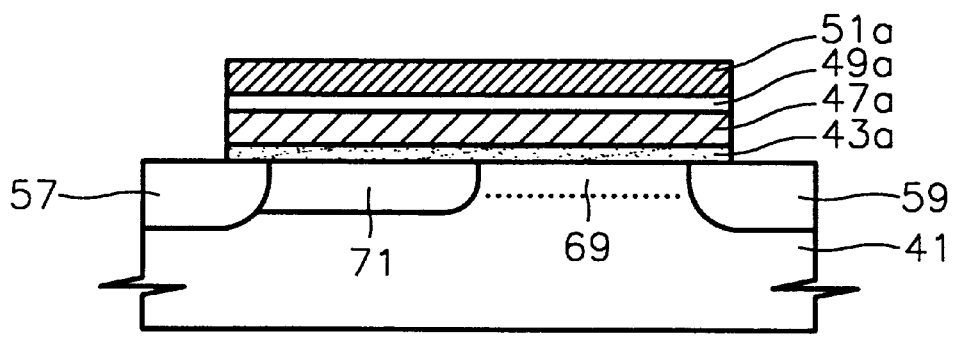

Referring now to FIGS. 21–22, methods of forming flash EEPROM devices according to a fifth embodiment of the present invention will be described. In particular, the method according to the fifth embodiment is similar to the method described with respect to FIGS. 14–18, however, the sequence of steps of forming the P+ impurity region 45 and then forming the N− region 55 are reversed in sequence. For example, referring now to FIG. 21, an impurity region 69 is formed in a semiconductor substrate 41 of first conductivity type (e.g., P-type). This impurity region 69 may be formed as a relatively lightly doped N-type region (e.g., N−) by implanting phosphorus (P) ions at an energy of about 40 KeV and a dose level of about $1 \times 10^{15}$ cm$^{-2}$ into a face of the substrate 41. Preferably, a sacrificial insulating film (not shown) is provided on the face of the substrate 41 to protect a portion of the substrate extending adjacent the face. After the impurity region 69 has been formed, the sacrificial insulating film is removed and then a first insulating film 43 (e.g., SiO$_2$) is formed on the face of the substrate 41. As described more fully hereinbelow, this first insulating film 43 is subsequently patterned as a tunneling oxide layer of an EEPROM memory device. The steps described with reference to FIGS. 15–16 are then performed. Referring now to FIG. 22, P+ impurity region 71 may be formed in the N− impurity region 69 by patterning a layer of photoresist to expose a portion of the stacked-gate electrode and then implanting boron (B) ions into the stacked-gate electrode at an energy of about 60 KeV and a dose level of about $5 \times 10^{13}$ cm$^{-2}$, using the patterned layer of photoresist as an implant mask. The photoresist layer is then removed. A thermal treatment step is then performed at a temperature of about 950° C. to diffuse the implanted boron ions and more fully define the P+ impurity region 71 at a position opposite the floating gate electrode 47a. Source and drain regions 57 and 59 are then formed by implanting arsenic (As) ions at an energy of about 70 KeV and a dose level of about $5 \times 10^{15}$ cm$^{-2}$, using the stacked-gate electrode as an implant mask. An insulating layer (not shown) is then formed on the structure of FIG. 22. Contact holes are then formed in the insulating layer and then metallization is patterned in the holes to complete the flash EEPROM device by providing electrical contacts thereto.

Figure 5A:
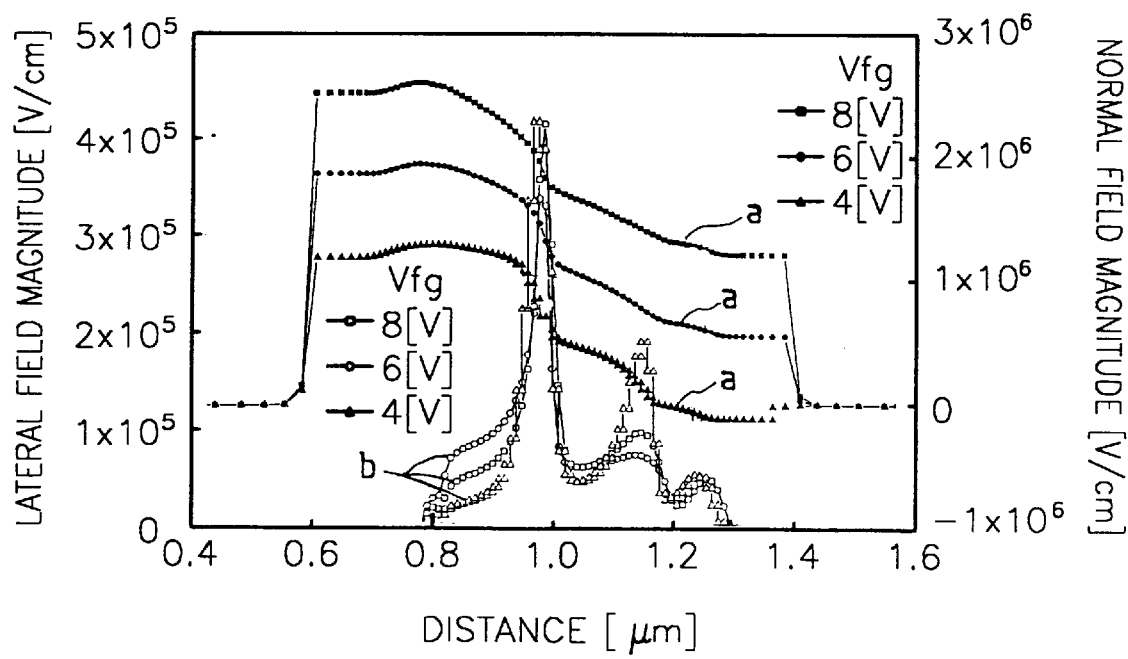
FIG. 5A is a graph of simulated lateral electric field magnitude and vertical electric field magnitude in the device of FIG. 3, versus lateral position, at floating gate biases of 4, 6 and 8 Volts.
Figure 5B:
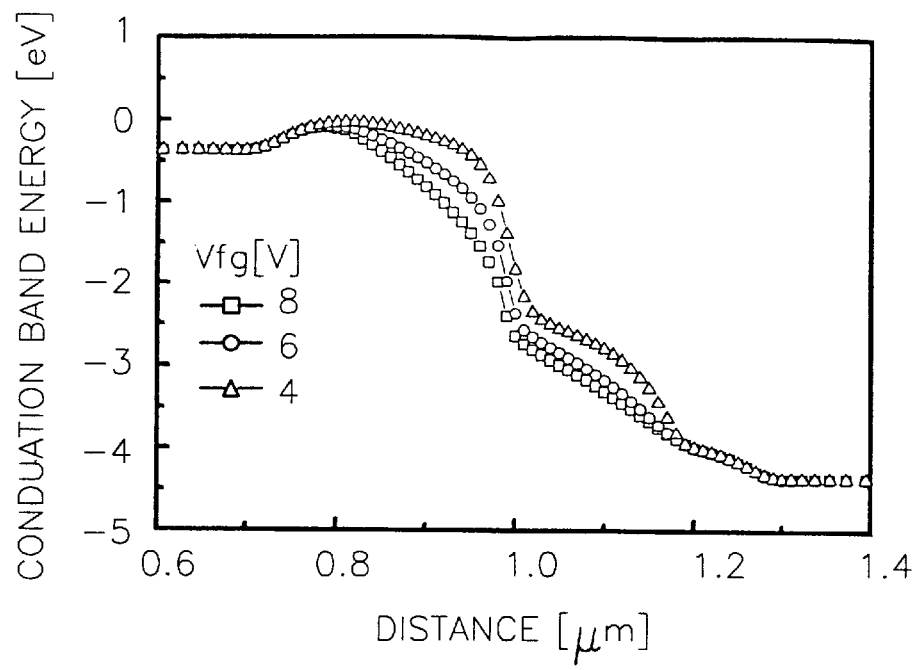
FIG. 5B is a graph of simulated conduction band energy in the device of FIG. 3, versus lateral position, at floating gate biases of 4, 6 and 8 Volts.
Figure 5C:
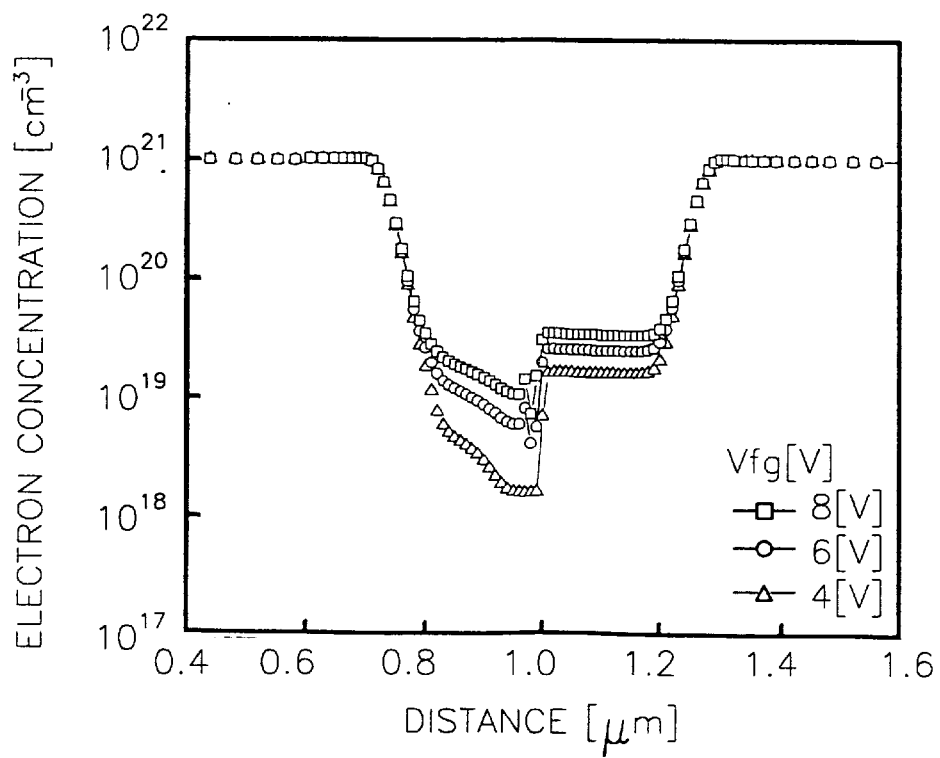
FIG. 5C is a graph of simulated electron concentration in the device of FIG. 3, versus lateral position, at floating gate biases of 4, 6 and 8 Volts.

Although the above discussion provides a full, complete and enabling description of the present invention, an additional discussion of the operation and performance characteristics of the aforementioned EEPROM devices will now be provided. FIGS. 5A–5C are graphs showing the simulated profiles along the channel of (i) the lateral and vertical components of the channel electric field, (ii) the conduction energy band exhibiting band bending and/or channel potential and (iii) the inverted electron concentration at the interface, respectively. The bias conditions used for the simulation are a drain voltage Vds=4 V and a floating gate voltage Vfg varying from 8 to 4 V. These bias conditions simulate the typical programming conditions. The width and length of the device are both 0.5 μm. A tunnel insulating layer below the floating gate and the dielectric layer between the floating gate and control gate are 100 Å and 200 Å in thickness, respectively. The coupling coefficient of the device is 0.75. In FIG. 5A, reference numbers "a" and "b" represents normal field magnitude and lateral field magnitude, respectively.

Figure 2:
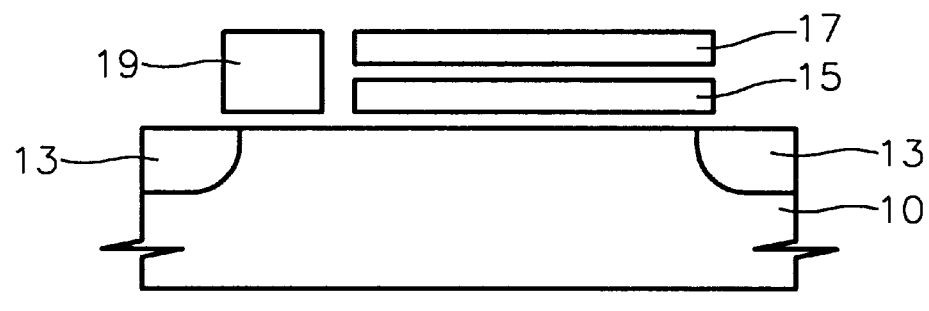
FIG. 2 is a cross-sectional view of a source-side injection EEPROM (SI-EEPROM) device according to the prior art and graph of simulated electric field magnitude in the channel region versus lateral position.
Figure 2:
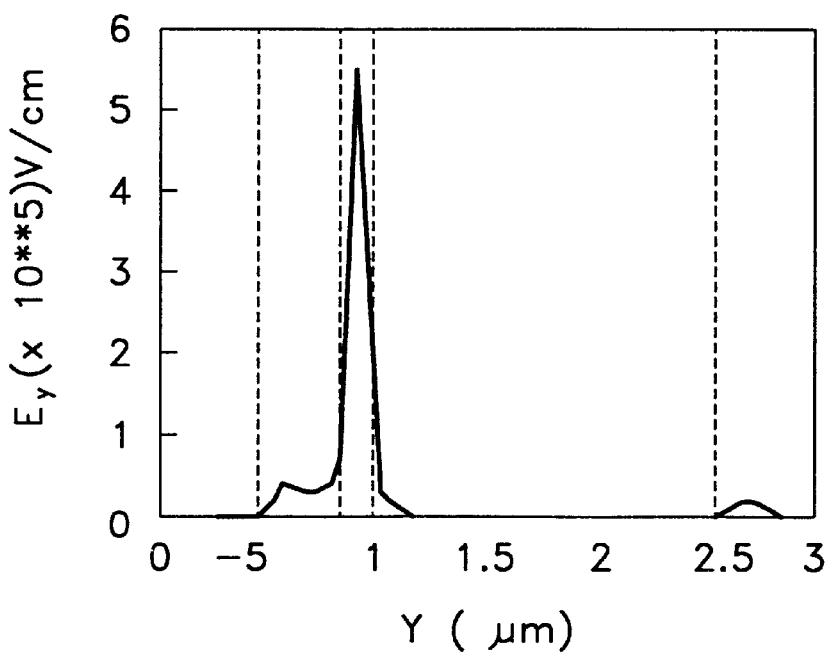

As shown in FIG. 5A, for large floating gate voltage, i.e. Vfg=8 V (as typically is the case at the beginning of programming), electrons are accumulated at the surface in the N$^-$ region 33 and the channel resistance of the depletion type section (B) of the device is further reduced. Hence nearly all of drain voltage Vds is transferred to the virtual drain of the enhancement type section (A) and dropped across the gated junction and the channel thereof is pinched off. As a consequence, a strong lateral field is developed therein. At the same time the large floating gate voltage Vfg induces the strong vertical field across the thin insulating layer as well as the channel. This means that hot electrons are efficiently generated near the mid-channel and are also efficiently redirected toward the floating gate for injection, as is the case in the split-gate SI-EEPROM device of FIG. 2.

With increasing program time and more excess electrons being stored in the floating gate, the floating gate voltage Vfg is lowered, i.e. 6 V. In this case the increased channel resistance of the depletion type section (B) of the device takes up a larger fraction of the drain voltage Vds and the peak of the lateral field magnitude in the junction decreases. As the large floating gate voltage Vfg is lowered, the vertical component of the channel electric field is also reduced; therefore, the program efficiency rapidly reduces. Furthermore, by lowering of floating gate voltage Vfg, i.e., 4 V, the channel of the depletion type section (B) is pinched off, and an additional high field region can be formed near the drain terminal, as in a conventional split-gate device, such as the device of FIG. 2.

The channel field profile in FIG. 5A enables the mid-channel injection of hot electrons for programming. The field configuration originates from the partitioning of the drain voltage Vds between the two types of transistors working in series. FIG. 5B shows the corresponding band bending in the channel or the distribution of the channel potential. For a large floating gate voltage Vfg, i.e., 8 V, the channel resistance of the depletion type section (B) is small, and all of the drain voltage Vds is essentially dropped in the enhancement type section (A), in particular, in the gated junction region, as is clear from FIG. 5B. When the floating gate voltage Vfg is lowered with increasing program time, a larger fraction of the drain voltage Vds is dropped across the depletion type section (B) as well. By further lowering of floating gate voltage Vfg, i.e., 4 V and a concomitant channel pinch-off near the drain, two high field regions can be formed as manifested by sharp downward band bending, one in the junction region and the other near the drain terminal.

The band bending in the channel, shown in FIG. 5B, correlates well with the inverted electron concentration profile at the interface, plotted in FIG. 5C. From these electron concentration profiles, the amount of band bending required at each point in the channel to keep a constant current throughout becomes apparent. The abrupt change in electron concentration in the gated junction channel region is a clear signature for high lateral field present even under a relatively small drain voltage Vds.

It has become clear that there is indeed a close analogy between the embodiments of the present invention and the split-gate memory cells. In the latter, source side injection was made possible by introducing the select gate and inducing channel pinch-off near the virtual drain. In the present embodiments, a similar injection scheme was implemented via the $P^+$-$N^-$ junction incorporated under the floating gate, as illustrated by FIG. 3. The $N^-$ region under the gate exhibits an active transistor role rather than a passive resistor connected in series with the enhancement type section (A) of the device. Similar programming efficiency can also be attained with the incorporation of a $P^+$-$P^-$ junction, as illustrated by FIG. 4.

Figure 6:
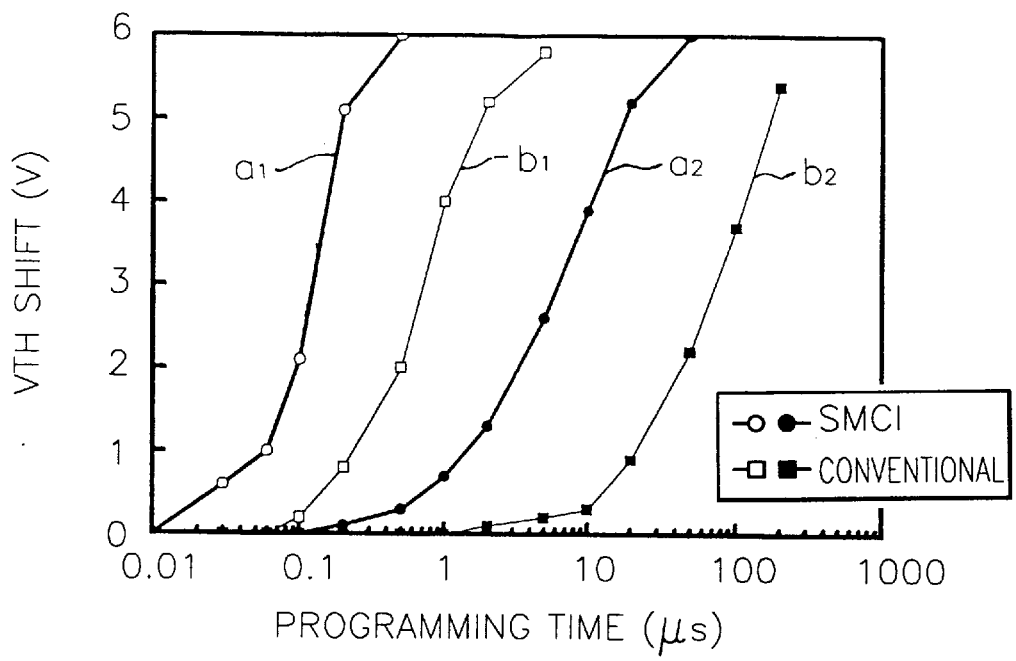
FIG. 6 is a graph of simulated threshold voltage in the device of FIG. 3 and a prior art flash EEPROM device, versus programming time, at different drain and control gate biases.

The illustrated embodiments of the present invention have been theoretically characterized and compared with other device structures by means of numerical simulations. However, the following discussion is based on experimental results. For example, FIG. 6 is a graph showing programming characteristics, where the shift of threshold voltage Vth is plotted versus time. The dimensions and parameters of EEPROM device used for measurement are the same as those mentioned above with reference to FIGS. 5A–5C. Also, the dimensions and parameters of the conventional stacked gate cell are the same as those of the preferred EEPROM device except that the drain side of the latter is doped with N-type impurity atoms. Further, reference symbols "$a_1$" and "$b_1$" are the result of applying a drain voltage Vds=5 V and a control gate voltage Vcg=10 V, and reference symbols "$a_2$" and "$b_2$" are the result of applying a drain voltage Vds=3 V and a control gate voltage Vcg=10 V.

As shown in FIG. 6, the SMCI cell of the present invention programs at a faster speed than the conventional cell by an order of magnitude. These results indicate that the mid-channel injection has much higher program efficiency than the drain side injection. Furthermore, the SMCI cell can be programmed in about 50 μs at a drain voltage Vds=3 V. This carries an attractive implication, namely that when SMCI cell parameters are refined and optimized, the high density NOR flash memory IC with the supply voltage of 3 V can be realized without the use of a charge pumping circuit. Since the power consuming internal high voltage generation is not necessary, it is also possible to increase bit size from 8 bits to 32 bits with SMCI cells.

The basic physics underlying the faster program speed in SMCI flash memory cell are further discussed. In so doing the potentials of the present invention can be assessed on a more fundamental level. The programming speed is directly commensurate with the electron flux into the floating gate. The flux can be measured for analysis as the gate current in the reference device where the control and floating gates are shorted.

Figure 7:
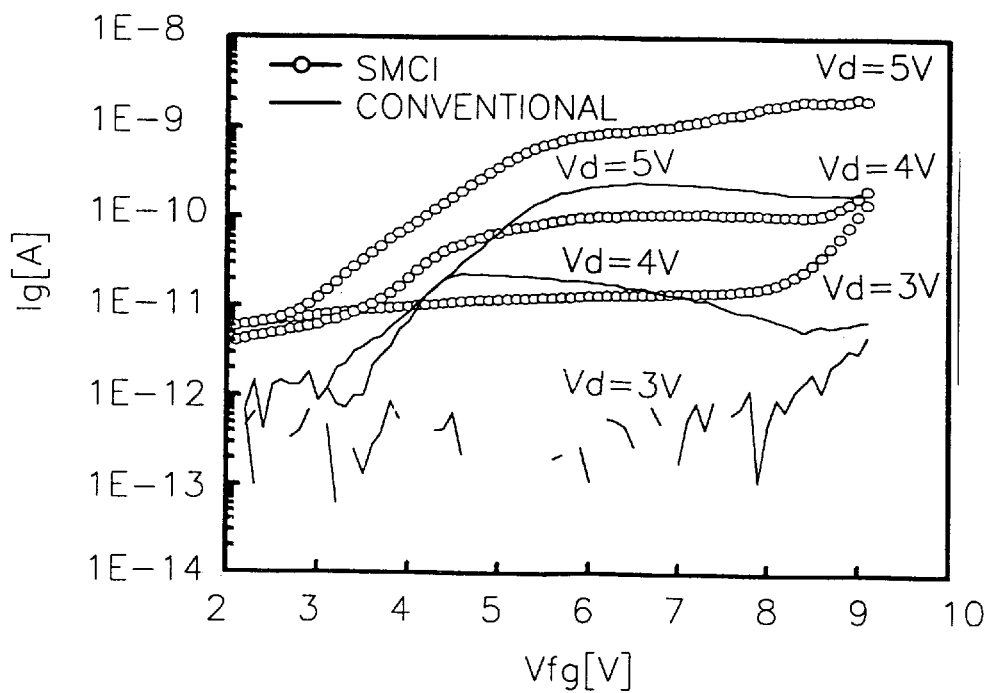
FIG. 7 is a graph of gate current ($I_g$) in the device of FIG. 3 and a prior art flash EEPROM device, versus floating gate bias ($V_{fg}$), during programming at different drain biases.

FIG. 7 is a graph showing a gate current Ig from the referenced SMCI cell and a stacked gate cell measured under programming conditions. As shown in FIG. 7, the measured gate current Ig versus floating gate voltage Vfg for different drain voltage Vd's from both conventional and SMCI memory cells are presented. Clearly, the gate current Ig from the SMCI cell is larger than those from the conventional cell for all drain voltages. It should be pointed out that the gate current Ig in the SMCI cell for small drain voltage, for example Vds=3 V, is larger than the corresponding Ig from the conventional device by about two orders of magnitude. This is again consistent with the fact that the SMCI can be programmed in 50 μs with a 3 V power supply voltage as shown in FIG. 6.

Figure 8:
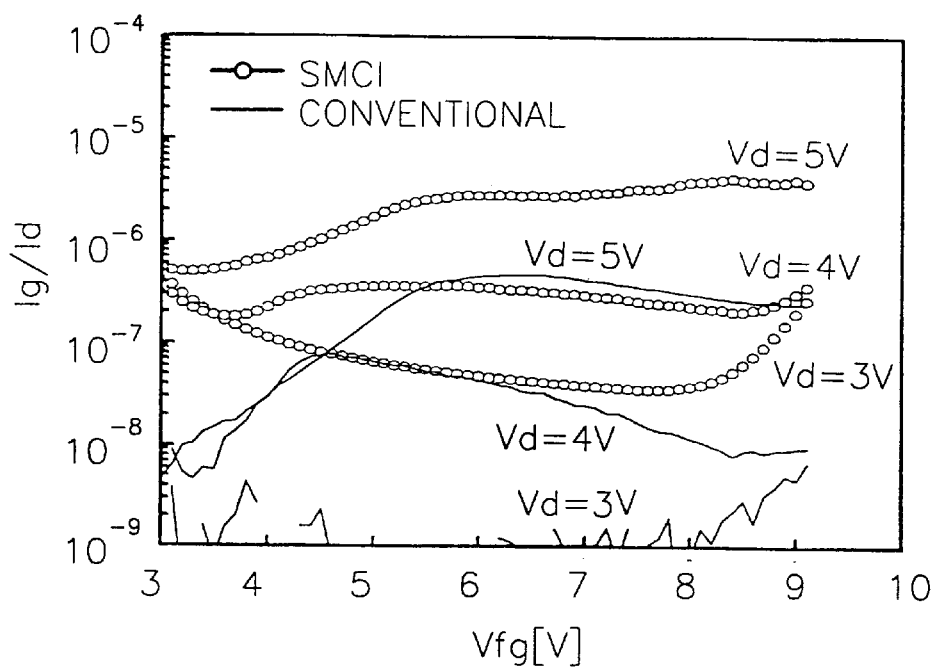
FIG. 8 is a graph of a ratio of gate current to drain current ($I_g/I_d$) in the device of FIG. 3 and a prior art flash EEPROM device, versus floating gate bias ($V_{fg}$), at different drain biases.

The program efficiency can be conveniently examined by a comparison with a few current ratio measurements from a reference device. The reference device is a device in which floating gate is electrically connected with the control gate. Inasmuch as the primary source of gate current Ig are those electrons contributing to the drain current, the efficiency is to be quantified via the ratio between the gate and drain currents, Ig/Id. FIG. 8 is a graph showing the ratio of gate current with drain current Ig/Id versus floating gate voltage Vfg measured from both conventional and SMCI reference cells. As shown in FIG. 8, the current ratio Ig/Id in the SMCI cell is understandably higher than the conventional stacked cell. In particular for low drain voltages, for example, Vds=3 V, the measured current ratio of $10^{-7}$ in the SMCI cell is larger than the value in the conventional cell by about two orders of magnitude. This is an attractive feature of the SMCI memory cell.

The high program efficiency, i.e. large Ig/Id value, is firmly rooted in the channel engineering in the SMCI cell. There are two factors which typically determine the electron flux into the floating gate; (i) the hot electron generation and (ii) collection of hot electrons into the floating gate. The former process can be monitored via the substrate (holes in this case) current Ib, since hot electrons are always generated in pairs with holes by impact ionization.

Figure 9:
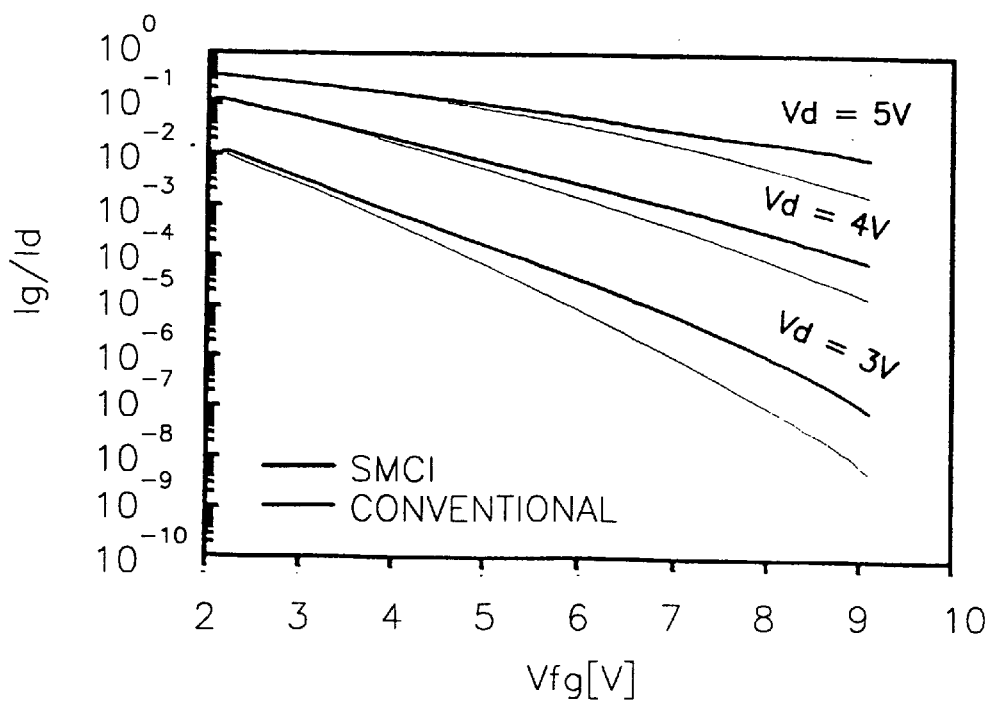
FIG. 9 is a graph of a ratio of substrate current to drain current ($I_b/I_d$) in the device of FIG. 3 and a prior art flash EEPROM device, versus floating gate bias ($V_{fg}$), at different drain biases.

FIG. 9 is a graph showing the ratio of substrate current with drain current Ib/Id versus floating gate voltage Vfg of the SMCI and conventional stacked gate reference cells. In detail, the current ratio, Ib/Id obviously represents the impact ionization efficiency. For large floating gate voltage Vfg, the impact ionization in the SMCI device is larger by about an order of magnitude. This is due to the shorter channel length of the enhancement type section of the SMCI device operating in the triode region. However, the data by and large indicates that the efficiency of impact ionization is approximately the same in both devices over a wide range of applied voltages.

The data of Ig/Id in FIG. 8 shows, on the other hand, that the program efficiency in the SMCI cell is much higher than what could be anticipated from the observed efficiency of generating hot electrons shown in FIG. 9. This is most clearly evidenced at the small drain voltage, i.e. Vds=3 V, for example, in which case the current ratio Ig/Id can differ in these devices by as much as two orders of magnitude. Therefore, the collection efficiency of hot electrons into the floating gate is much higher in the SMCI cell. The large collection efficiency in the SMCI cell is rooted in the channel engineering which enables the mid-channel injection. When the hot electrons are generated deep inside the channel, the hot electrons have much longer dwell times in the channel before exiting through the drain terminal. Hence the hot electrons have a higher probability of being redirected toward the floating gate for injection. Additionally with the presence of a strong vertical field in the channel as well as the gate oxide, injection and/or collection efficiency should be enhanced via Schottky barrier lowering of the gate oxide.

Figure 10A:
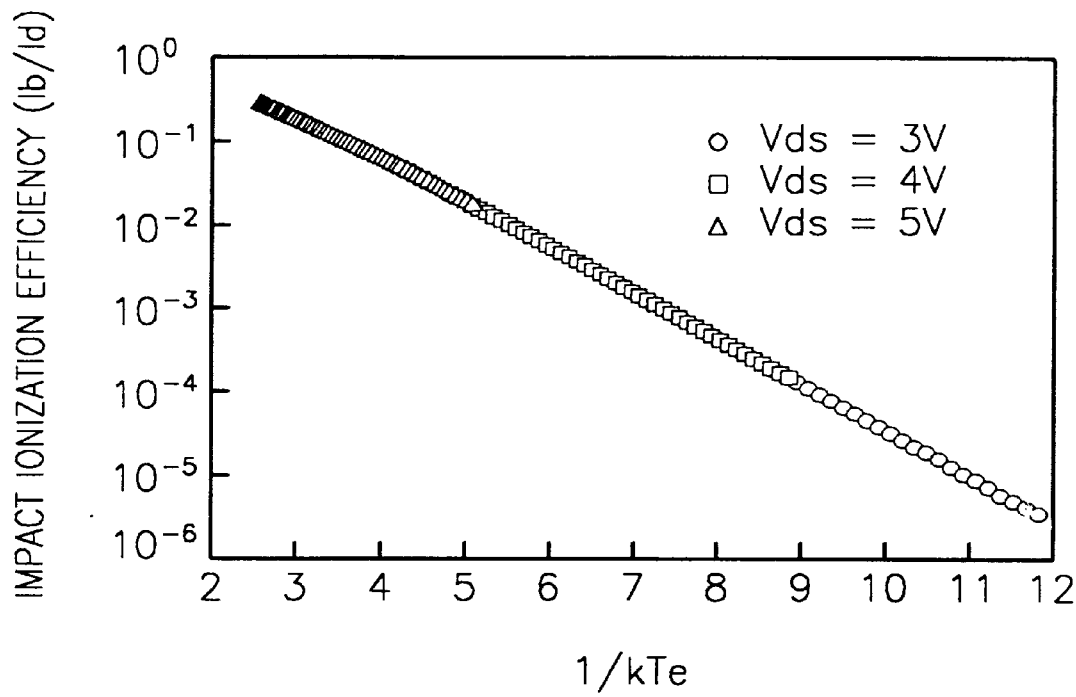
FIGS. 10A–10B are graphs of impact ionization efficiency versus the inverse of thermal energy of hot electrons ($1/kT_e$) in a prior art flash EEPROM device and the device of FIG. 3, at different drain biases.
Figure 10B:
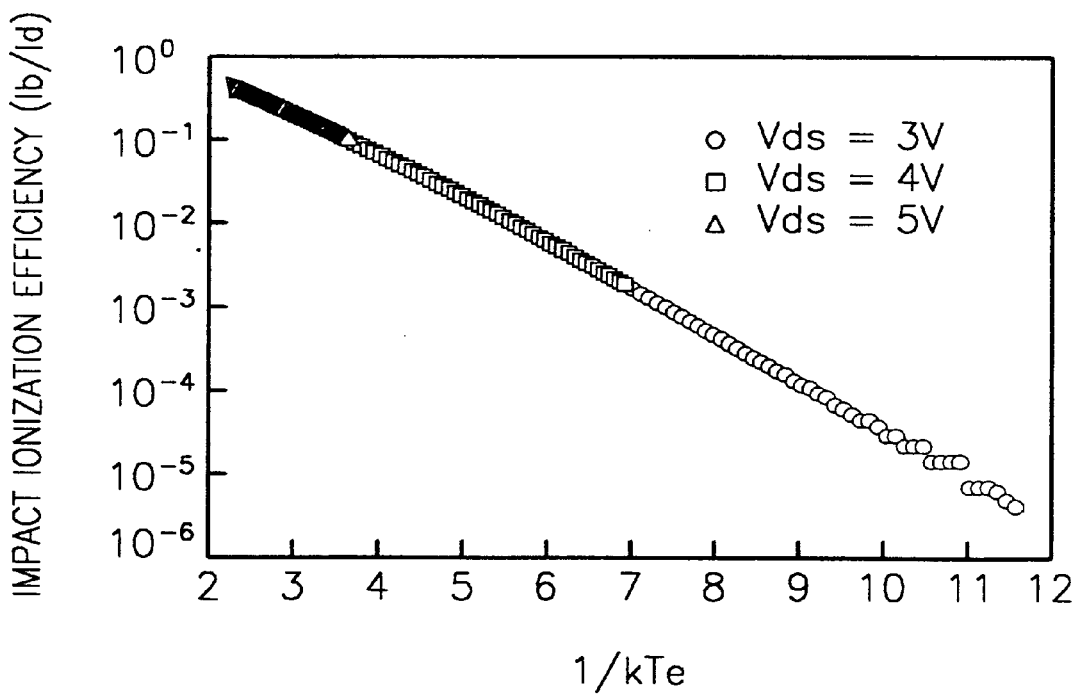

Thus far the program efficiency has been discussed on a conceptual basis, using the measured current ratio, Ig/Id and Ib/Id. The discussion is further augmented by semiquantitative analysis or interpretation of the same data. FIG. 10A and FIG. 10B are graphs showing the ionization efficiency (Ib/Id) versus the inverse thermal energy of hot electrons (1/kTe) according to the conventional reference stacked gate cell and SMCI reference cell, respectively. Here "k" is the Boltzmann constant and "Te" is electron temperature in Kelvin. In FIGS. 10A and 10B, hot electrons were assumed to be described by Maxwell-Boltzmann distribution function. FIGS. 10A and 10B are insightful in that the current ratio, Ib/Id, measured over a wide range of floating gate voltage Vfg (3–8 V), and Vd are well fitted by a straight line on a semilog scale. This suggests that the elevated temperature model of hot electrons is valid for the ranges of biases used for programming. Further, the two straight lines in FIGS. 12A and 12B virtually overlap with each other on this inverse electron temperature axis. This is remarkable in view of the fact that these two sets of ionization data were taken from two reference devices of different structures. FIGS. 10A and 10B are therefore direct experimental proof that the impact ionization in the high field region is a universal process, dependent only on the elevated temperature of hot electrons.

Figure 11A:
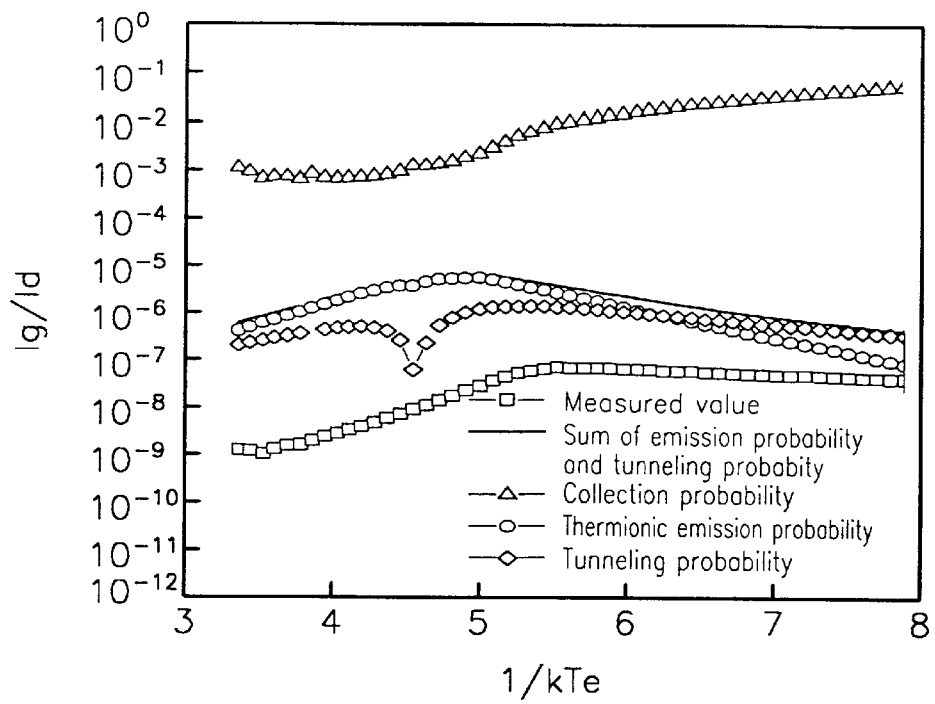
FIGS. 11A–11B are graphs of program efficiency ($I_g/I_d$) versus the inverse of thermal energy of hot electrons ($1/kT_e$) in a prior art flash EEPROM device and the device of FIG. 3, at different drain biases.
Figure 11B:
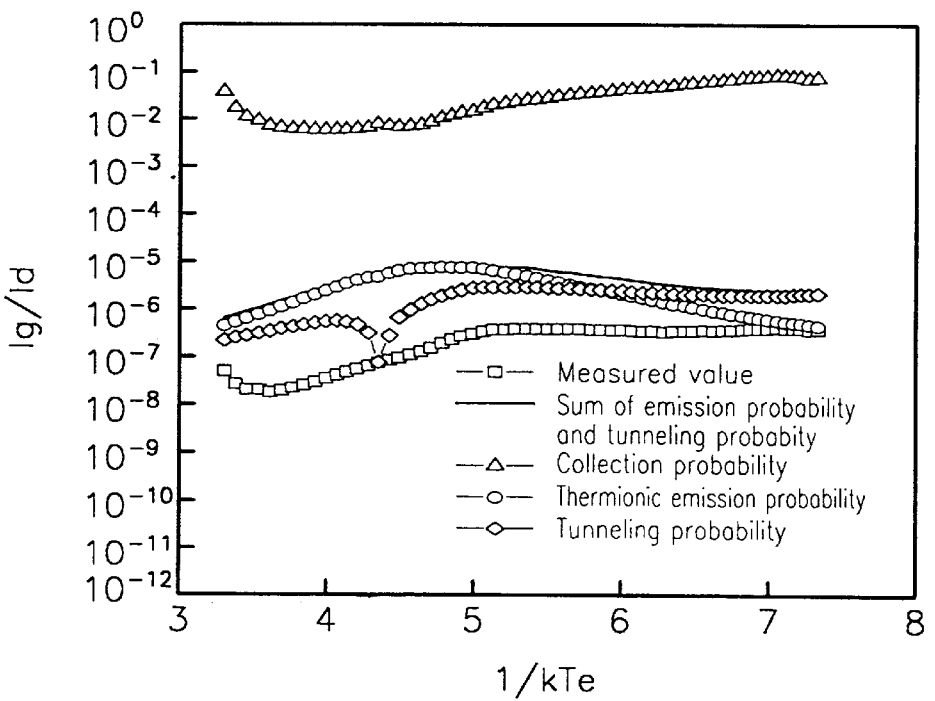

FIGS. 11A and 11B are graphs showing the program efficiency Ig/Id versus the inverse electron energy (1/kTe) measured from the conventional reference stacked gate and SMCI reference cells. In detail, FIG. 11A summarizes the empirical quantification of the program efficiency, Ig/Id, measured from the conventional stacked gate device. In FIG. 11A, Ig/Id data was plotted versus the inverse hot electron temperature or energy. Also shown in FIG. 11A, is the thermionic as well as the tunneling probability of those electrons whose energy is near 3 eV or beyond. The sum of these two probability versus the electron energy is larger than the measured data. The difference between the two should therefore represent the collection efficiency of those hot electrons which actually end up in the floating gate. The collection efficiency decreases with increases in electron kinetic energy, as expected. Further, FIG. 11B presents the corresponding data from the SMCI cell, together with similar theoretical curves. The collection efficiency is higher in the SMCI device, in particular for smaller drain voltages, as noted earlier.

Figure 12:
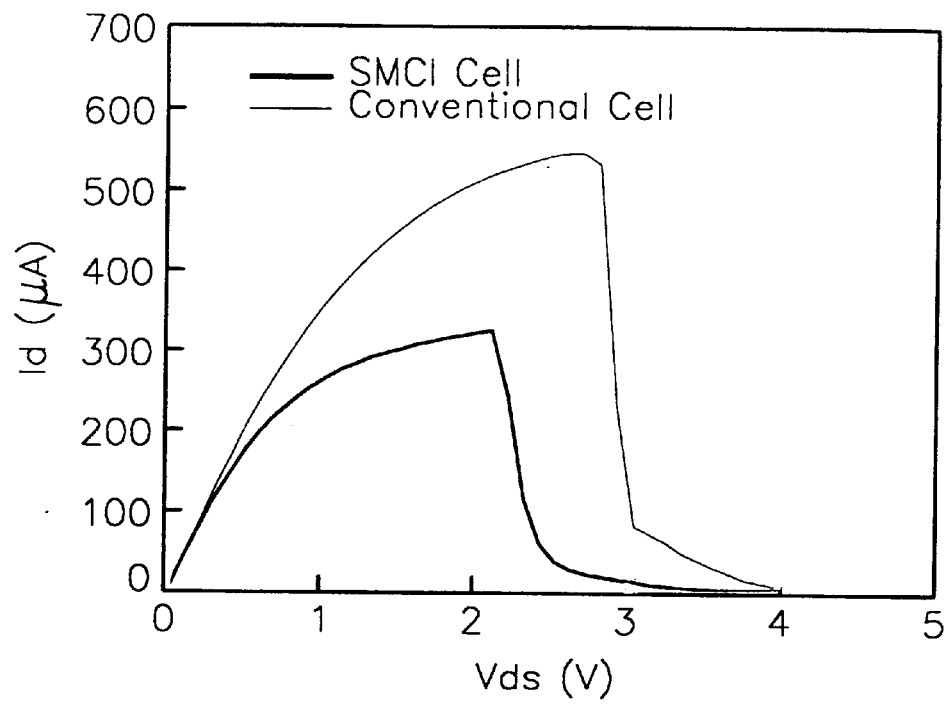
FIG. 12 is a graph of drain current ($I_d$) in the device of FIG. 3 and a prior art flash EEPROM device, versus drain-to-source bias ($V_{ds}$), during programming.

Next the data obtained from the conventional and SMCI flash memory cell are shown for further comparison and discussion. FIG. 12 is a graph showing Id versus the drain voltage Vds from SMCI programming characteristics. In detail, FIG. 12 compares the transistor Id-Vds curves from SMCI and conventional cells under condition of Vcg=10 V, exhibiting the one time programming characteristics. The SMCI cell is shown to consume 50% less power than the conventional cell at the onset of programming as evidenced by rapid decrease of drain current.

Figure 13:
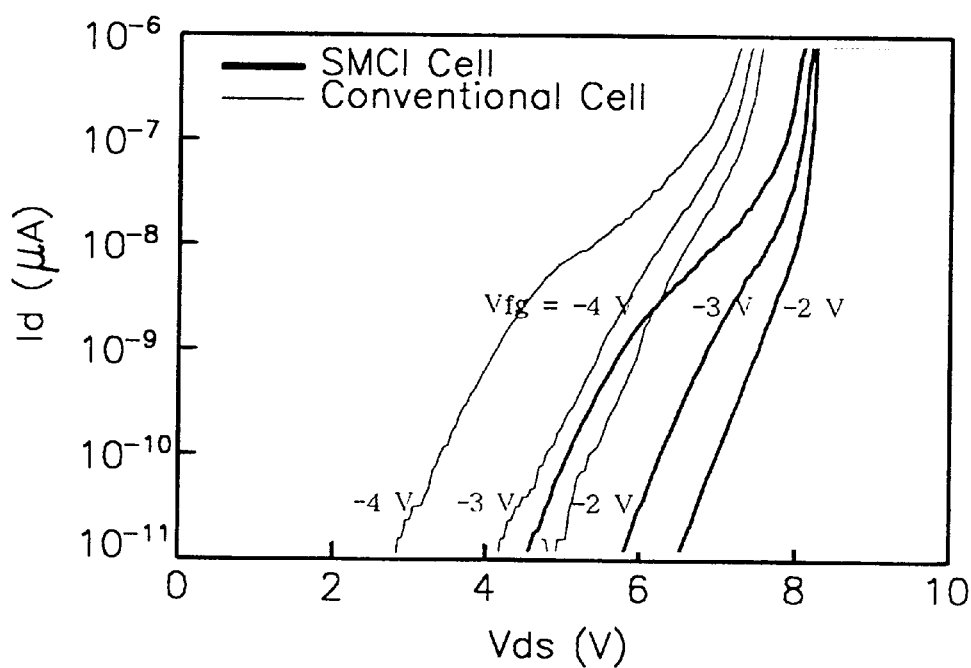
FIG. 13 is a graph of off-state drain current ($I_d$) in the device of FIG. 3 and a prior art flash EEPROM device, versus drain-to-source bias ($V_{ds}$), at floating gate biases ($V_{fg}$) of −2, −3 and −4 Volts.

FIG. 13 is a graph showing the OFF current (Id) versus the drain voltage (Vds) at various Vfg's from both SMCI and conventional stacked gate cell. In detail, the leakage currents detected in both cells are due to band-to-band tunneling of electrons. One can clearly observe from FIG. 13 that the graded nature of the p-n junction under the floating gate in the SMCI cell results in drastically reduced leakage current at given OFF regime gate biases, compared with the conventional device. The smaller leakage level gives larger junction tolerance condition, as will be understood by those skilled in the art.

As mentioned above, the SMCI flash memory cell has been discussed in great detail from theoretical and experimental viewpoints. Theoretically, the structure of the cell was shown optimal for efficient programming. Because of the built-in high electric field in the gated junction depletion region, small drain voltage can give rise to high lateral field for impact ionization for hot electron generation and subsequent emission for programming. Additionally the longer dwelling time in the channel results in enhancing the collection efficiency. Experimentally, the program speed in an SMCI cell was shown faster by a factor of 10 and more importantly the device can be programmed with low voltage and low power with larger junction tolerance condition.

Consequently, since the SMCI cell of the flash EEPROM device according to the present invention can have an area the same as that manufactured in the conventional stacked gate cell, the integration becomes higher than that of the conventional split gate cell. Also, the program efficiency of the SMCI cell of the flash EEPROM device according to the present invention, compared to that of the conventional stacked gate cell, can be enhanced. Further, the device having an SMCI cell can be programmed with low voltage and low power.

Additionally, the erasing in an SMCI cell is done via field emission of electrons from the floating gate to the drain rather than to the grounded common source as in the conventional stacked gate cell. Hence the erase can be done in byte unit in each SMCI cell, overcoming thereby the limitation of large sector erase in the conventional flash memories.

Furthermore during erasure in the conventional flash cell, the large band bending occurring from the interface into the $N^+$ source diffusion gives rise to the generation of electron-hole pairs. Those generated holes are in turn accelerated along the channel by the large lateral electric field in the reverse biased $N^+$-P source junction and can be trapped in the oxide. This results in various adverse effects such as (i) overerasure, (ii) enhanced gate disturbance and (iii) stress induced changes in device parameters. However, the holes in double diffused drain in SMCI device are in an lateral field much smaller than the case of $N^+$-P source junction. Therefore, the above adverse effects accompanying erase in conventional device are to be suppressed significantly in the SMCI cell.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A flash EEPROM device, comprising:

a substrate having source and drain regions of first conductivity type semiconductor therein extending adjacent a surface thereof;

a semiconductor channel region in said substrate, said channel region containing a first region of second conductivity type semiconductor extending adjacent said source region and a second region of predetermined conductivity type semiconductor extending between said first region and said drain region, said second region having a lower first conductivity type dopant concentration therein than said drain region and a lower second conductivity type dopant concentration therein than said first region;

a control gate electrode on said substrate, opposite said semiconductor channel region; and a floating gate electrode disposed between said control gate electrode and said semiconductor channel region; and wherein said substrate comprises a bulk region of second conductivity type semiconductor extending to the surface; wherein said source and drain regions form respective P-N junctions with said bulk region; wherein said first region forms a non-rectifying semiconductor junction with said bulk region; and wherein said second region has a lower second conductivity type dopant concentration therein than said bulk region.

2. The flash EEPROM device of claim 1, wherein said second region forms a non-rectifying semiconductor junction with said bulk region.

3. The flash EEPROM device of claim 2, wherein said first region has a higher second conductivity type dopant concentration therein than said bulk region.

4. The flash EEPROM device of claim 3, wherein said second region has a lower second conductivity type dopant concentration therein than said bulk region.

5. The flash EEPROM device of claim 1, wherein said second region forms a P-N junction with said bulk region.

6. The flash EEPROM device of claim 5, wherein said first region has a higher second conductivity type dopant concentration therein than said bulk region.

7. The flash EEPROM device of claim 6, wherein said second region, first region, source region and control gate electrode collectively form an enhancement mode field effect transistor; and wherein said drain region, second region, first region and control gate electrode collectively form a depletion mode field effect transistor.

8. A flash EEPROM device, comprising:
  a semiconductor substrate of second conductivity type having source and drain regions of first conductivity type therein extending to a surface thereof and a channel region extending between said source and drain regions;
  a floating gate electrode on the surface, opposite said channel region;
  a control gate electrode on said floating gate electrode, opposite the channel region; and
  a threshold voltage offset region of second conductivity type in said channel region, said threshold voltage offset region extending to the surface and forming a P-N junction with said source region and having a higher second conductivity type dopant concentration therein than said substrate;
  wherein said drain region forms an N+/P+ junction with said threshold voltage offset region and an N+/P junction with said substrate; and wherein said source region forms an N+/P− junction with said channel region.

9. A flash EEPROM device, comprising:
  a semiconductor substrate of second conductivity type having source and drain regions of first conductivity type therein extending to a surface thereof and a channel region extending between said source and drain regions;
  a floating gate electrode on the surface, opposite said channel region;
  a control gate electrode on said floating gate electrode, opposite the channel region; and
  a threshold voltage offset region of second conductivity type in said channel region, said threshold voltage offset region extending to the surface and forming a P-N junction with said source region and having a higher second conductivity type dopant concentration therein than said substrate;
  wherein said drain region forms an N+/P+ junction with said threshold voltage offset region, and an N+/P junction with said substrate; wherein said source region forms an N+/N− junction with said channel region; and wherein said threshold voltage offset region forms an P+/N− junction with said channel region.

* * * * *